US007804318B2

(12) United States Patent
Guan et al.

(10) Patent No.: US 7,804,318 B2
(45) Date of Patent: Sep. 28, 2010

(54) BURNING SYSTEM HAVING OPTIC-ELECTRIC TRANSFORMER AND COMPARATOR CIRCUIT AND METHOD FOR BURNING LIQUID CRYSTAL DISPLAY

(75) Inventors: Sai-Xin Guan, Shenzhen (CN); Xiang-An Gu, Shenzhen (CN)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 778 days.

(21) Appl. No.: 11/811,523

(22) Filed: Jun. 11, 2007

(65) Prior Publication Data

US 2007/0285367 A1 Dec. 13, 2007

(30) Foreign Application Priority Data

Jun. 9, 2006 (CN) ........................ 2006 1 0061069

(51) Int. Cl.
*G01R 31/00* (2006.01)

(52) U.S. Cl. ....................................... 324/770; 324/760

(58) Field of Classification Search ........................ None
See application file for complete search history.

(56) References Cited

U.S. PATENT DOCUMENTS 6,388,716 B1 * 5/2002 Tsuzuki et al. .............. 348/687
6,873,307 B2 3/2005 Nitta et al.
6,879,311 B2 * 4/2005 Sono ........................... 345/94
7,057,593 B2 6/2006 Cho

FOREIGN PATENT DOCUMENTS

CN 1462991 A 12/2003
FR 2789836 A1 8/2000

* cited by examiner

*Primary Examiner*—Minh N Tang
(74) *Attorney, Agent, or Firm*—Wei Te Chung

(57) ABSTRACT

An exemplary burning system (600) for a liquid crystal display (670) includes an optic-electric transformer (610), a comparator circuit (650), and a micro-controller unit (660). The optic-electric transformer is configured for measuring optical flicker of a liquid crystal display, and transforming the measurement into a corresponding flicker signal. The comparator circuit is configured for receiving the flicker signal, comparing a voltage of the flicker signal to a reference voltage, determining whether optical flicker of the liquid crystal display is acceptable or nonexistent based on the comparison, and determining a parameter representing an optimum common voltage of the liquid crystal display when the optical flicker of the liquid crystal display is acceptable or nonexistent. The micro-controller unit is configured for burning the parameter into the liquid crystal display. A related method for burning a liquid crystal display is also provided.

16 Claims, 4 Drawing Sheets

BURNING SYSTEM HAVING OPTIC-ELECTRIC TRANSFORMER AND COMPARATOR CIRCUIT AND METHOD FOR BURNING LIQUID CRYSTAL DISPLAY

FIELD OF THE INVENTION

The present invention relates to a burning system for a liquid crystal display (LCD), the burning system including an optic-electric transformer and a comparator circuit. The present invention also relates to a method for burning an LCD.

GENERAL BACKGROUND

LCDs are commonly used as display devices for compact electronic apparatuses, because they not only provide good quality images but are also very thin.

Referring to FIG. 3, a typical active matrix LCD 100 includes a first glass substrate 10, a second glass substrate 20 parallel to but spaced apart from the first substrate 10, a liquid crystal layer 30 sandwiched between the first and second substrates 10, 20, and a driving integrated circuit (IC) 120 bonded on the first substrate 10.

Referring also to FIG. 4, the first substrate 10 includes a number n (where n is a natural number) of gate lines 101 that are parallel to each other and that each extend along a first direction, and a number m (where m is also a natural number) of data lines 102 that are parallel to each other and that each extend along a second direction orthogonal to the first direction. The intersecting gate lines 101 and data lines 102 define a plurality of pixel units. The first substrate 10 also includes a plurality of thin film transistors (TFTs) 106 that function as switching elements. Each TFT 106 is provided in the vicinity of a respective point of intersection of the gate lines 101 and the data lines 102. The first substrate 10 further includes a plurality of pixel electrodes 103 formed on a surface thereof that faces toward the second substrate 20.

The second substrate 20 includes a plurality of common electrodes 105 opposite to the pixel electrodes 103. In particular, the common electrodes 105 are formed on a surface of the second substrate 20 that faces toward the first substrate 10. The common electrodes 105 are made from a transparent material such as ITO (indium-tin oxide) or the like.

FIG. 5 is an equivalent circuit diagram of one of the pixel units of the active matrix LCD 100. A gate electrode "g", a source electrode "s", and a drain electrode "d" of the TFT 106 are connected to a corresponding gate line 101, a corresponding data line 102, and a corresponding pixel electrode 103 respectively. Liquid crystal material of the liquid crystal layer 30 sandwiched between the pixel electrode 103 and a corresponding common electrode 105 on the second substrate 20 is represented as a liquid crystal capacitor $C_{lc}$. $C_{gd}$ is a parasitic capacitor formed between the gate electrode "g" and the drain electrode "d" of the TFT 106.

When the active matrix LCD 100 works, an electric field between the pixel electrode 103 and the common electrode 105 is generated. The electric field drives the liquid crystal material of the liquid crystal layer 30 at the pixel unit. Light beams from a light source such as a backlight pass through the first substrate 10, the liquid crystal layer 30, and the second substrate 20. The amount of light beams penetrating the first and second substrates 10, 20 is adjusted by controlling the strength of the electric field, in order to obtain a desired optical output for the pixel unit.

If an electric field with a certain direction is continuously provided to the liquid crystal material between the pixel electrode 103 and the common electrode 105, the liquid crystal material may deteriorate. Therefore in order to avoid this problem, pixel voltages that are provided to the pixel electrode 103 are switched from a positive value to a negative value with respect to a common voltage. This technique is referred to as an inversion drive method.

FIG. 6 is an abbreviated timing chart illustrating operation of the active matrix LCD 100. In the chart, the x-axis represents time, and the y-axis (not shown) represents voltage. $V_g$ represents a plurality of scanning signals provided by the driving IC 120. $V_d$ represents a plurality of gradation voltages provided by the driving IC 120. $V_p$ represents a plurality of pixel voltages of the pixel electrode 103. $\Delta V_g$ represents an impulse width of each of the scanning signals $V_g$, and equals the difference between a gate-on signal $V_{on}$ and a gate-off signal $V_{off}$. $V_{com}$ represents a common voltage of the common electrode 105 provided by an external circuit (not shown). $\Delta V$ represents a voltage distortion related to the pixel voltage $V_d$.

When a gate-on voltage $V_{on}$ is provided to the gate electrode "g" of the TFT 106 via the gate line 101, the TFT 106 connected to the gate line 101 turns on. At the same time, a gradation voltage $V_d$ generated by the driving IC 120 is provided to the pixel electrode 103 via the data line 102 and the activated TFT 106 in series. The potentials of the common electrodes 105 are set at a uniform potential $V_{com}$. Thus, an electric field is generated by the voltage difference between the pixel electrode 103 and the common electrode 105. The electric field is used to control the amount of light transmission of the corresponding pixel unit.

When a gate-off voltage $V_{off}$ is provided to the gate electrode "g" of the TFT 106 via the gate line 101, the TFT 106 turns off. The gradation voltage $V_d$ provided to the liquid crystal capacitor $C_{lc}$ while the TFT 106 was turned on should be maintained after the TFT 106 turns off. However, due to the parasitic capacitance $C_{gd}$ between the gate electrode "g" and the drain electrode "d" of the TFT 106, the gradation voltage $V_d$ provided to the pixel electrode 103 is distorted. This kind of voltage distortion $\Delta V$ is known as a kick-back voltage, and the kick-back voltage is obtained by following formula:

$$\Delta V = \frac{C_{gd} \cdot \Delta V_g}{C_{gd} + \Delta V_g} = \frac{C_{gd} \cdot (V_{on} - V_{off})}{C_{gd} + \Delta V_g} \tag{1}$$

The voltage distortion $\Delta V$ always tends to reduce the pixel voltage $V_p$ regardless of the polarity of the data voltage, as shown in FIG. 6.

In an ideal active matrix LCD 100, as shown by a dashed line $V_d$ in FIG. 6, when the gate-on voltage $V_{on}$ is provided to turn on the TFT 106, the gradation voltage $V_d$ is provided to the pixel electrode 103; and thereby, when the gate-off voltage $V_{off}$ is provided to turn off the TFT 106, the provided gradation voltage $V_d$ should be maintained as the pixel voltage. But in the actual active matrix LCD 100, as shown by a solid line $V_p$ in FIG. 6, when the scanning signal $V_g$ falls, the pixel voltage $V_p$ is reduced by the kickback voltage $\Delta V$.

An actual value of the voltage applied to the liquid crystal material is obtained from the area between the pixel voltage $V_p$ line and the common voltage $V_{com}$ line in FIG. 6. In one time frame ("Frame"), the pixel voltage $V_p$ is greater than the common voltage $V_{com}$, and this area can be considered to be a 'positive' area. In an adjacent frame, the pixel voltage $V_p$ is less than the common voltage $V_{com}$, and this area can be considered to be a 'negative' area. When the active matrix LCD 100 is driven by an inversion drive method, the level of the common voltage $V_{com}$ must be adjusted to keep the positive area of the one frame equal to the negative area of the adjacent frame. Therefore, a common voltage $V_{com}$ satisfying the above-mentioned condition needs to be supplied to the common electrode 105 in order to suppress optical flicker phenomena of a display screen of the active matrix LCD 100.

Referring to FIG. 7, a typical burning system 510 for the active matrix LCD 100 is shown connected to the active matrix LCD 100. The burning system 510 is used to burn a parameter representing an optimum common voltage into an erasable programmable read only memory (EPROM) of the active matrix LCD 100 at the time the active matrix LCD 100 is manufactured. The EPROM thus stores the parameter for use when the active matrix LCD 100 is operated by an end user. The burning system 510 includes a first button 511 configured to adjust a common voltage provided to the active matrix LCD 100 by the burning system 510, and a second button 512 configured to launch a burning program of the burning system 510.

In operation of the burning system 510, the burning system 510 generates a plurality of common voltages, and provides the common voltages to drive the active matrix LCD 100. A human operator adjusts the common voltages until the optical flicker of the active matrix LCD 100 disappears. Then the second button 512 is pressed, and the burning program is launched to burn the parameter representing the current common voltage into the EPROM of the active matrix LCD 100.

The parameter burned into the active matrix LCD 100 is determined by the human operator observing the optical flicker of the active matrix LCD 100. This process involves manual work, and relies on the human operator's judgment. The process is somewhat inefficient, and may result in an inaccurate observation or an incorrect determination being made. Thus, the reliability of the burning system 510 may not be satisfactory.

What is needed, therefore, is a burning system for an LCD that can overcome the above-described deficiencies. What is also needed is a burning method using the burning system.

SUMMARY

In one preferred embodiment, a burning system for a liquid crystal display includes an optic-electric transformer, a comparator circuit, and a micro-controller unit. The comparator circuit includes a voltage comparator, and a reference voltage generator configured for generating a reference voltage. The optic-electric transformer is configured for measuring optical flicker of a liquid crystal display, and transforming the measurement into a corresponding flicker signal. The voltage comparator is configured for receiving the flicker signal, comparing a voltage of the flicker signal to the reference voltage, and generating a result signal based on the comparison. The micro-controller unit is configured for adjusting a common voltage provided to the liquid crystal display in order to reduce or eliminate the optical flicker of the liquid crystal display, if the result signal indicates the optical flicker is in excess of a predetermined threshold, and is configured for burning a parameter of the common voltage provided to the liquid crystal display into the liquid crystal display, if the result signal indicates the optical flicker is within the predetermined threshold or does not exist.

Other novel features, advantages and aspects will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of at least one embodiment of the present invention. In the drawings, like reference numerals designate corresponding parts throughout various views, and all the views are schematic.

DETAILED DESCRIPTION OF PREFERRED EMBODIMENTS

Reference will now be made to the drawings to describe preferred and exemplary embodiments of the present invention in detail.

Figure 1:
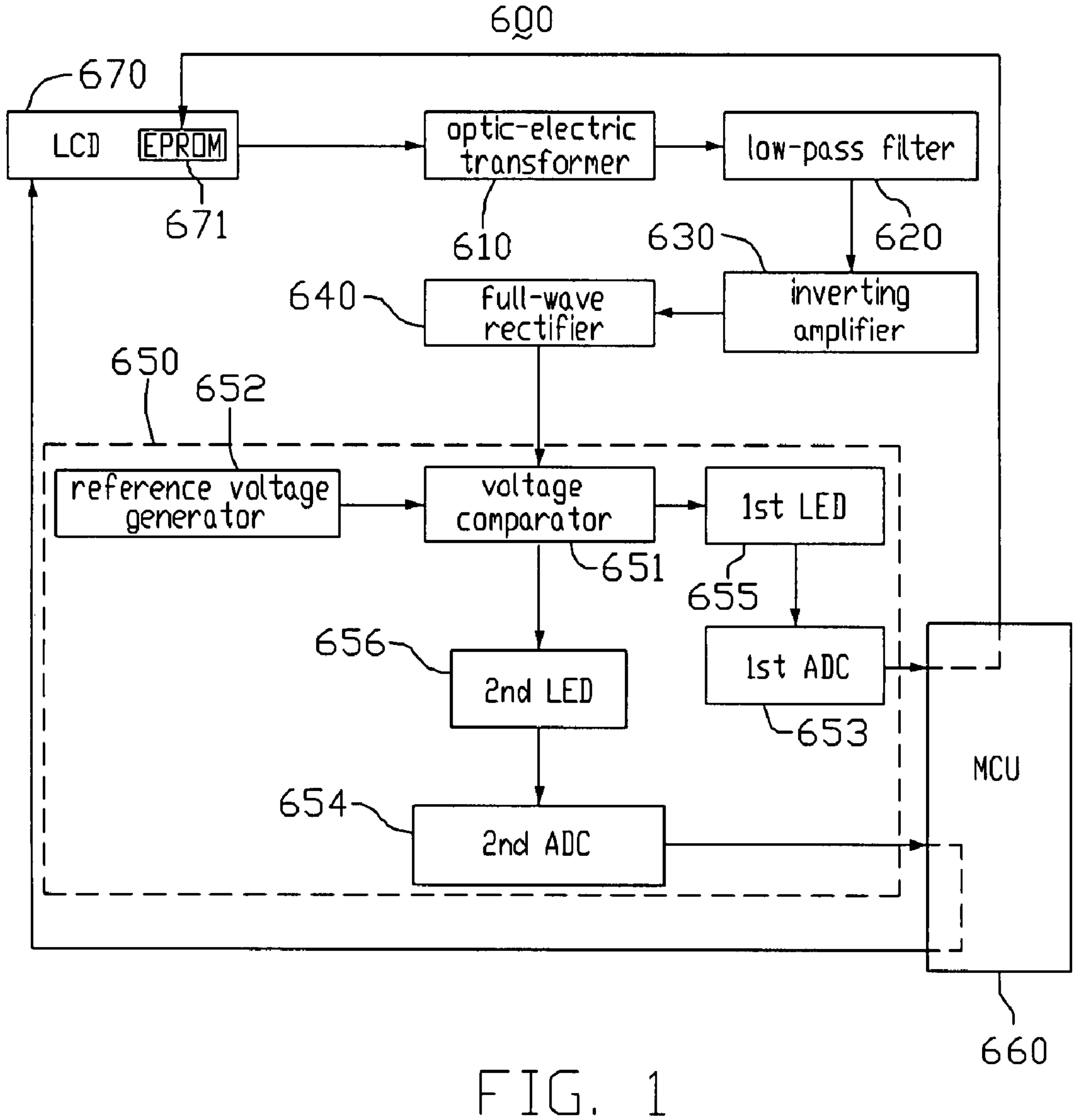
FIG. 1 is a block diagram of a burning system for an LCD according to an exemplary embodiment of the present invention.

Referring to FIG. 1, a burning system for an LCD according to an exemplary embodiment of the present invention is shown. The burning system 600 includes an optic-electric transformer 610, a low-pass filter 620, an inverting amplifier 630, a full-wave rectifier 640, a comparator circuit 650, and a micro-controller unit (MCU) 660. The burning system 600 is shown connected to an LCD 670. The LCD 670 includes an EPROM 671 therein.

The comparator circuit 650 includes a voltage comparator 651, a reference voltage generator 652, a first light emitting diode (LED) 655, a first analog-to-digital circuit (ADC) 653, a second LED 656, and a second ADC 654. In the exemplary embodiment, the first LED 655 is a green LED, and the second LED 656 is a red LED.

The optic-electric transformer 610 detects light beams emitted from the LCD 670, measures an amount of optical flicker of the light beams, generates a flicker signal according to the measured optical flicker, and transmits the flicker signal to the low-pass filter 620. That is, the optic-electric transformer 610 transforms the optical flicker of the LCD 670 into the flicker signal, and transmits the flicker signal to the low-pass filter 620. A voltage of the flicker signal increases with an increasing degree of the optical flicker. The flicker signal is processed by the lower-pass filter 620, the inverting amplifier 630, and the full-wave rectifier 640 in that sequence, and is transmitted to the voltage comparator 651 of the comparator circuit 650.

The reference voltage generator 652 generates a reference voltage, and provides the reference voltage to the voltage comparator 651. The voltage comparator 651 compares the voltage of the flicker signal to the reference voltage, and generates a result signal. In particular, the voltage comparator 651 generates a first result signal indicating that a burning procedure can be launched, if the voltage of the flicker signal is less than the reference voltage. In such case, the optical flicker of the LCD 670 typically has disappeared or is negligible. Conversely, the voltage comparator 651 generates a second result signal indicating that a common voltage provided to the LCD 670 needs to be adjusted, if the voltage of the flicker signal is greater than or equal to the reference voltage. In such case, the optical flicker of the LCD 670 typically still exists to a significant degree.

The first result signal is transmitted to the first ADC 653 via the first LED 655. The first ADC 653 transforms the first result signal to a first digital signal, and transmits the first digital signal to the MCU 660. A burning program in the MCU 660 is launched to burn a parameter of the common voltage into the EPROM 671 of the LCD 670. The parameter represents an optimum common voltage for the LCD 670.

The second result signal is transmitted to the second ADC 654 via the second LED 656. The second ADC 654 transforms the second result signal into a second digital signal, and transmits the second digital signal to the MCU 660. The MCU 660 automatically adjusts the common voltage provided to the LCD 670 according to the second digital signal. That is, the common voltage is increased or decreased by a voltage step to reduce the optical flicker of the LCD 670. In a preferred embodiment, the voltage step is 0.1 V.

Figure 2:
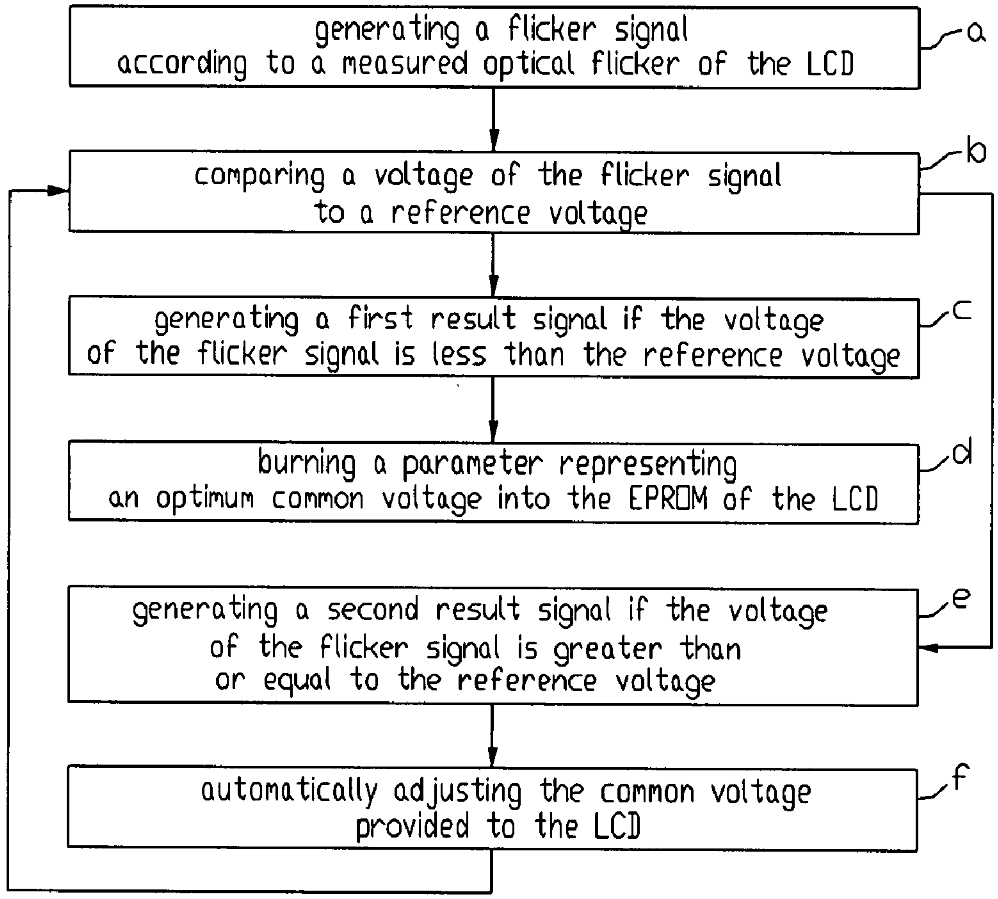
FIG. 2 is a flow chart showing a method for burning an LCD according to another exemplary embodiment of the present invention.
Figure 3:
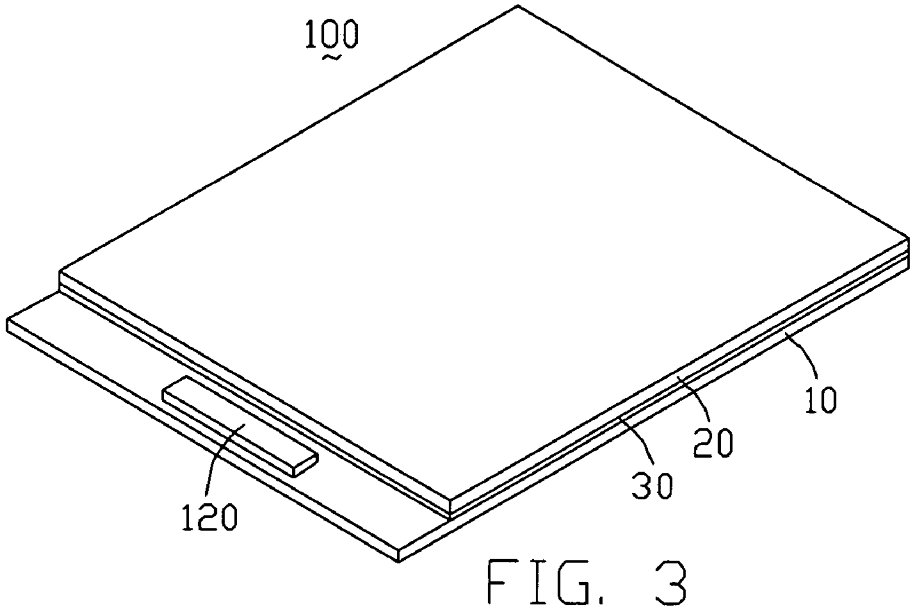
FIG. 3 (RELATED ART)
FIG. 3 is an isometric view of a conventional active matrix LCD.
Figure 4:
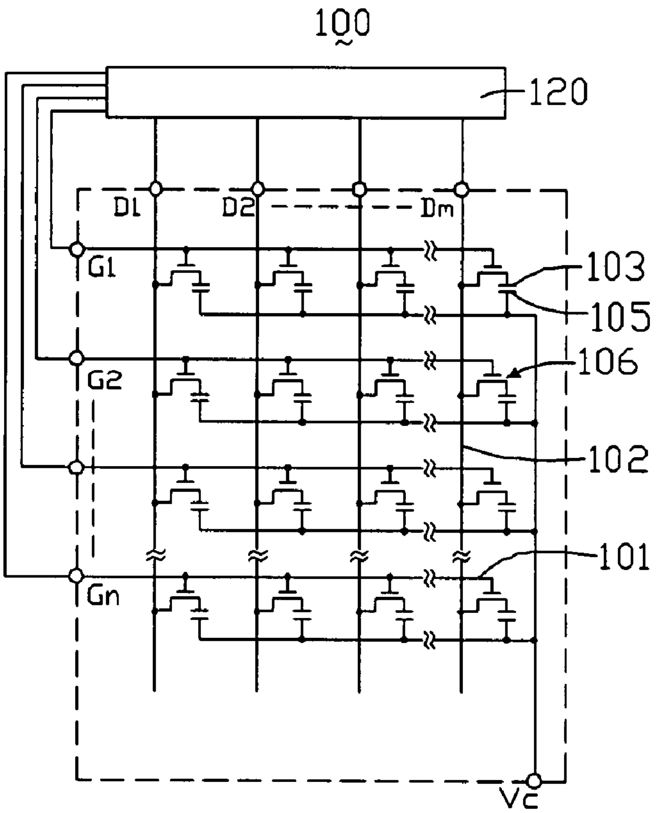
FIG. 4 (RELATED ART)
FIG. 4 is an essentially abbreviated circuit diagram of the active matrix LCD of FIG. 3.
Figure 5:
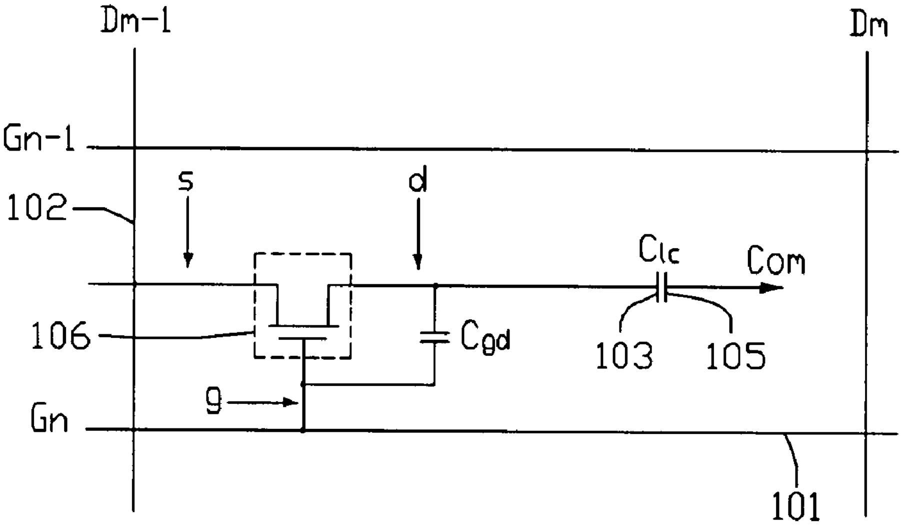
FIG. 5 (RELATED ART)
FIG. 5 is an equivalent circuit diagram of one pixel unit of the active matrix LCD of FIG. 3.
Figure 6:
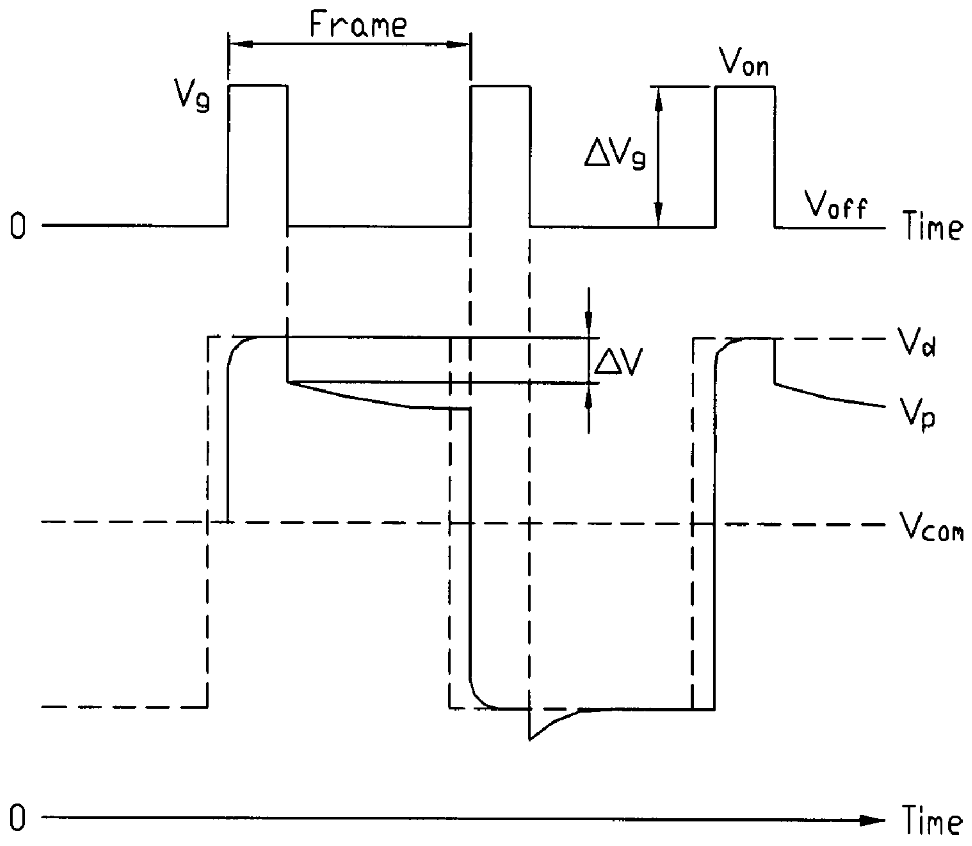
FIG. 6 (RELATED ART)
FIG. 6 is an abbreviated timing chart illustrating operation of the active matrix LCD of FIG. 3.
Figure 7:
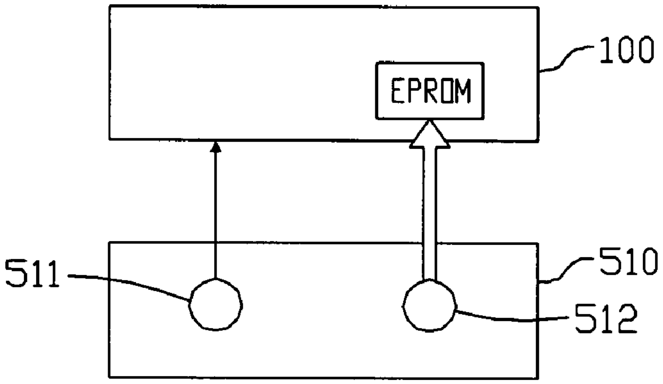
FIG. 7 (RELATED ART)
FIG. 7 is a block diagram of a conventional burning system connected to the active matrix LCD of FIG. 3.

Referring to FIG. 2, an exemplary burning method for burning the LCD 670 includes the following steps. In step (a), a flicker signal according to the optical flicker of the LCD 670 is generated. In step (b), a voltage of the flicker signal is compared to a reference voltage, thus generating a result signal. In particular, if the voltage of the flicker signal is less than the reference voltage, in step (c), a first result signal is generated. The first result signal indicates that a burning procedure can be launched. Thus, the procedure goes directly to step (d) described below. On the other hand, if the voltage of the flicker signal is greater than or equal to the reference voltage, in step (e), a second result signal is generated. The second result signal indicates that a common voltage provided to the LCD 670 needs to be adjusted. Thus, the procedure goes to step (f) described below.

In step (d), a parameter representing an optimum common voltage is burned into the EPROM 671 of the LCD 670, whereupon the procedure is completed. In step (f), the common voltage provided to the LCD 670 is automatically adjusted. That is, the common voltage is increased or decreased by a voltage step to reduce the optical flicker of the LCD 670, whereupon the procedure returns to step (b). The cycle of steps (b), (e) and (f) is performed iteratively until the result signal in step (b) leads to a first result signal being generated in step (c).

In summary, the optic-electric transformer 610 of the burning system 600 can transform the optical flicker of the LCD 670 into the flicker signal, which helps to determine whether the optical flicker of the LCD 670 is essentially eliminated or not. The burning system 600 can automatically adjust the common voltage provided to the LCD 670, and can burn the optimum parameter of the common voltage into the LCD 670 with the help of the optic-electric transformer 610. All this is automatically performed by the burning system 600, with no need for manual work. Therefore, the process is efficient, and results in an accurate determination of the optimum parameter burned into the LCD 670. Thus, a reliability of the burning system 600 is improved.

In alternative embodiments, the first and second ADCs 653, 654 can instead be a single ADC. The first LED 655 can be a red or a blue LED, and the second LED 656 can be a blue or a green LED. The first and second LEDs 655, 656 can be consolidated in a single bicolor LED.

It is believed that the present embodiments and their advantages will be understood from the foregoing description, and it will be apparent that various changes may be made thereto without departing from the spirit or scope of the invention or sacrificing all of its material advantages, the examples hereinbefore described merely being exemplary embodiments of the invention.

What is claimed is:

1. A burning system for a liquid crystal display, the burning system comprising:

an optic-electric transformer configured for measuring optical flicker of a liquid crystal display, and transforming the measurement into a corresponding flicker signal;

a comparator circuit comprising:

a reference voltage generator configured for generating a reference voltage; and a voltage comparator configured for receiving the flicker signal, comparing a voltage of the flicker signal to the reference voltage, and generating a result signal based on the comparison; and a micro-controller unit configured for adjusting a common voltage provided to the liquid crystal display in order to reduce or eliminate the optical flicker of the liquid crystal display, if the result signal indicates the optical flicker is in excess of a predetermined threshold, and configured for burning a parameter of the common voltage provided to the liquid crystal display into the liquid crystal display, if the result signal indicates the optical flicker is within the predetermined threshold or does not exist.

2. The burning system as claimed in claim 1, further comprising a low-pass filter, an inverting amplifier, and a full-wave amplifier, wherein the flicker signal is respectively processed by the lower-pass filter, the inverting amplifier, and the full-wave rectifier in that sequence, and is then transmitted to the voltage comparator of the comparator circuit.

3. The burning system as claimed in claim 1, wherein the comparator circuit further comprises an analog-to-digital circuit, and the analog-to-digital circuit is configured to transform the result signal to a digital signal, and to transmit the digital signal to the micro-controller unit.

4. The burning system as claimed in claim 3, wherein the digital signal is a burn signal when the voltage of the flicker signal is less than the reference voltage.

5. The burning system as claimed in claim 4, wherein the comparator circuit further comprises an indicator, and the result signal is transmitted to the analog-to-digital circuit via the indicator when the voltage of the flicker signal is less than the reference voltage.

6. The burning system as claimed in claim 5, wherein the indicator is a light emitting diode.

7. The burning system as claimed in claim 3, wherein the digital signal is an adjust signal when the voltage of the flicker signal is greater than the reference voltage.

8. The burning system as claimed in claim 7, wherein the comparator circuit further comprises an indicator, and the result signal is transmitted to the analog-to-digital circuit via the indicator when the voltage of the flicker signal is greater than the reference voltage.

9. The burning system as claimed in claim 8, wherein the indicator is a light emitting diode.

10. A method for burning a liquid crystal display, the burning method comprising:

generating a flicker signal according to an amount of optical flicker of a liquid crystal display;

comparing a voltage of the flicker signal to a reference voltage, and generating a first result signal if the voltage of the flicker signal is less than the reference voltage, the first result signal indicating that a burning procedure can be launched; and burning a parameter representing an optimum common voltage of the liquid crystal display into the liquid crystal display.

11. The burning method as claimed in claim 10, wherein comparing the voltage of the flicker signal to the reference voltage further comprises generating a second result signal if the voltage of the flicker signal is greater than or equal to the reference voltage, the second result signal indicating that a common voltage provided to the liquid crystal display needs to be adjusted to reduce the optical flicker of the liquid crystal display.

12. The burning method as claimed in claim 11, further comprising adjusting the common voltage provided to the liquid crystal display to reduce the optical flicker of the liquid crystal display, and again generating a flicker signal according to an amount of optical flicker of the liquid crystal display.

13. A burning system for a liquid crystal display, the burning system comprising:

an optic-electric transformer configured for measuring optical flicker of a liquid crystal display, and transforming the measurement into a corresponding flicker signal;

a comparator circuit configured for receiving the flicker signal, comparing a voltage of the flicker signal to a reference voltage, determining whether optical flicker of the liquid crystal display is acceptable or nonexistent based on the comparison, and determining a parameter representing an optimum common voltage of the liquid crystal display when the optical flicker of the liquid crystal display is acceptable or nonexistent; and a micro-controller unit configured for burning the parameter into the liquid crystal display.

14. The burning system as claimed in claim 13, wherein the comparator circuit comprises a reference voltage generator configured for generating the reference voltage.

15. The burning system as claimed in claim 14, wherein the comparator circuit further comprises a voltage comparator, the voltage comparator is configured for receiving the flicker signal, comparing the voltage of the flicker signal to the reference voltage, and generating a result signal based on the comparison.

16. The burning system as claimed in claim 15, wherein the micro-controller unit is further configured for adjusting a common voltage provided to the liquid crystal display in order to reduce or eliminate optical flicker of the liquid crystal display, when the comparator circuit determines that the optical flicker of the liquid crystal display is not acceptable based on the result signal.

* * * * *